US012154620B2

(12) United States Patent
Chen et al.

(10) Patent No.: US 12,154,620 B2

(45) Date of Patent: Nov. 26, 2024

(54) METHOD AND APPARATUS TO IMPROVE READ LATENCY OF A MULTI-THRESHOLD LEVEL CELL BLOCK-BASED NON-VOLATILE MEMORY

(71) Applicant: SK hynix NAND Product Solutions Corp., San Jose, CA (US)

(72) Inventors: Lei Chen, Sunnyvale, CA (US); Yogesh B. Wakchaure, Folsom, CA (US); Aliasgar S. Madraswala, Folsom, CA (US); Xin Guo, San Jose, CA (US); Cole Uhlman, Vancouver (CA)

(73) Assignee: SK hynix NAND Product Solutions Corp., San Jose, CA (US)

( * ) Notice: Subject to any disclaimer, the term of this patent is extended or adjusted under 35 U.S.C. 154(b) by 0 days.

(21) Appl. No.: 16/586,214

(22) Filed: Sep. 27, 2019

(65) Prior Publication Data

US 2020/0027503 A1 Jan. 23, 2020

(51) Int. Cl.

*G11C 11/56* (2006.01)
*G06F 3/06* (2006.01)
*G11C 16/08* (2006.01)
*G11C 16/32* (2006.01)

(52) U.S. Cl.

CPC ........ *G11C 11/5642* (2013.01); *G06F 3/0604* (2013.01); *G06F 3/0632* (2013.01); *G06F 3/064* (2013.01); *G06F 3/0659* (2013.01); *G06F 3/0679* (2013.01); *G11C 16/08* (2013.01); *G11C 16/32* (2013.01)

(58) Field of Classification Search

None

See application file for complete search history.

(56) References Cited

U.S. PATENT DOCUMENTS 9,268,631 B2 2/2016 Leem et al.
9,640,281 B1 * 5/2017 Seo ........................ G06F 3/0604
2007/0291556 A1 * 12/2007 Kamei ............... G11C 16/0483 365/189.09
2012/0084490 A1 * 4/2012 Choi .................. G11C 16/3418 711/103
2012/0307565 A1 * 12/2012 Aritome ................. G11C 16/10 365/185.22
2016/0124642 A1 * 5/2016 Kim ...................... G06F 3/0673 711/156
2016/0141044 A1 * 5/2016 Sun ........................ G11C 16/20 365/185.11
2016/0170871 A1 * 6/2016 Hyun .................... G06F 3/0653 711/103

(Continued)

*Primary Examiner* — Yaima Rigol
*Assistant Examiner* — Alexander J Yoon
(74) *Attorney, Agent, or Firm* — Byrne Poh LLP

(57) ABSTRACT

A method and apparatus to reduce read retry operations in a NAND Flash memory is provided. To reduce the number of read retries for future reads, a word line group is assigned an optimal read voltage, the reference voltage that results in eliminating the read error for the word line is selected as the optimal read voltage (also referred to as a “sticky voltage”) for the word line group to be used for a next read of the page. An optimal read voltage per word line group for the page per NAND Flash memory die is stored in the lookup table. Storing an optimal read voltage per word line group instead of per die reduces the number of read retries.

15 Claims, 9 Drawing Sheets

(56) References Cited

U.S. PATENT DOCUMENTS

2017/0162270 A1* 6/2017 Park ....................... G11C 16/26
2018/0012667 A1* 1/2018 Costa ..................... G11C 16/26
2018/0034485 A1* 2/2018 Marelli ................ G11C 29/028
2018/0181462 A1* 6/2018 Shukla ............... G11C 16/0483
2019/0006003 A1* 1/2019 Kirshenbaum ........ G11C 16/10
2019/0042356 A1 2/2019 Chen et al.
2019/0180829 A1 6/2019 Chen et al.
2019/0362796 A1* 11/2019 Choi ................... G11C 11/5635
2020/0117527 A1* 4/2020 Tomic ................. G06F 11/1402

* cited by examiner

| | LP | UP | XP | TP |
|---|---|---|---|---|
| Sequential Read | 4% | 15% | 11% | 32% |
| Random Read | 5X | 5X | 3X | 9X |

FIG. 5

| | LP | UP | XP | TP |
|---|---|---|---|---|
| Sequential Read | 31% | 15% | 3% | 9% |
| Random Read | 2.5X | 2X | 2X | 6X |

FIG. 6

| Read Bias Component | Power Persistent | Firmware Managed | Unique for Word Line Groups | Set Feature/MLBi |
|---|---|---|---|---|
| Base Voltage | Yes | No | No | MLBi |
| Word Line Group Offsets | Yes | No | Yes | MLBi |
| Moving Read Reference and Auto Read Calibration offsets | No | Yes | No | Set Feature/MLBi |

FIG. 7

METHOD AND APPARATUS TO IMPROVE READ LATENCY OF A MULTI-THRESHOLD LEVEL CELL BLOCK-BASED NON-VOLATILE MEMORY

FIELD

This disclosure relates to multi-threshold level cell block-based non-volatile memory and in particular to improving read latency of block-based multi-threshold level cell non-volatile memory.

BACKGROUND

Non-volatile memory refers to memory whose state is determinate even if power is interrupted to the device. Storage devices that include non-volatile memory include a secure digital card, a multimedia card, a flash drive (for example, a Universal Serial Bus (USB) flash drive also known as a "USB thumb drive" or "USB memory stick" that includes non-volatile memory with an integrated USB interface), and a solid-state drive. The non-volatile memory can comprise a block addressable memory device, such as NAND, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND).

The NAND flash cell uses the threshold voltage of a floating-gate transistor to represent the data stored in the cell. In a SLC NAND flash memory, each memory cell has two voltage levels corresponding to two states (0, 1) to represent one bit. In a MLC, TLC and QLC NAND flash memory, each memory cell stores more than one bit. Each cell in a MLC NAND Flash memory uses four voltage levels corresponding to four states (00, 01, 10, 11) to represent 2 bits of binary data. Each cell in a TLC NAND Flash memory uses eight voltage levels corresponding to eight states (000 to 111) to represent 3 bits of binary data. Each cell in a QLC NAND Flash memory uses sixteen voltage levels corresponding to sixteen states (0000 to 1111) to represent 4 bits of binary data.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 5 is a table of simulation results after 1.5K program/erase cycles have been performed in a QLC NAND Flash memory that has an optimal read voltage per word line group illustrating the reduction of read retries;

FIG. 6 is a table of simulation results after 3K program/erase cycles have been performed in a QLC NAND Flash memory that has an optimal read voltage per word line group;

FIG. 7 is a table illustrating components of the read bias voltage for a word line group;

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

An MLC NAND Flash memory cell is programmed to one of four threshold voltages based on the logical value that the flash memory cell represents. The logical multi-bit value stored in the Flash cell is read by comparing a threshold voltage of the Flash memory cell with reference voltages.

Figure 1:
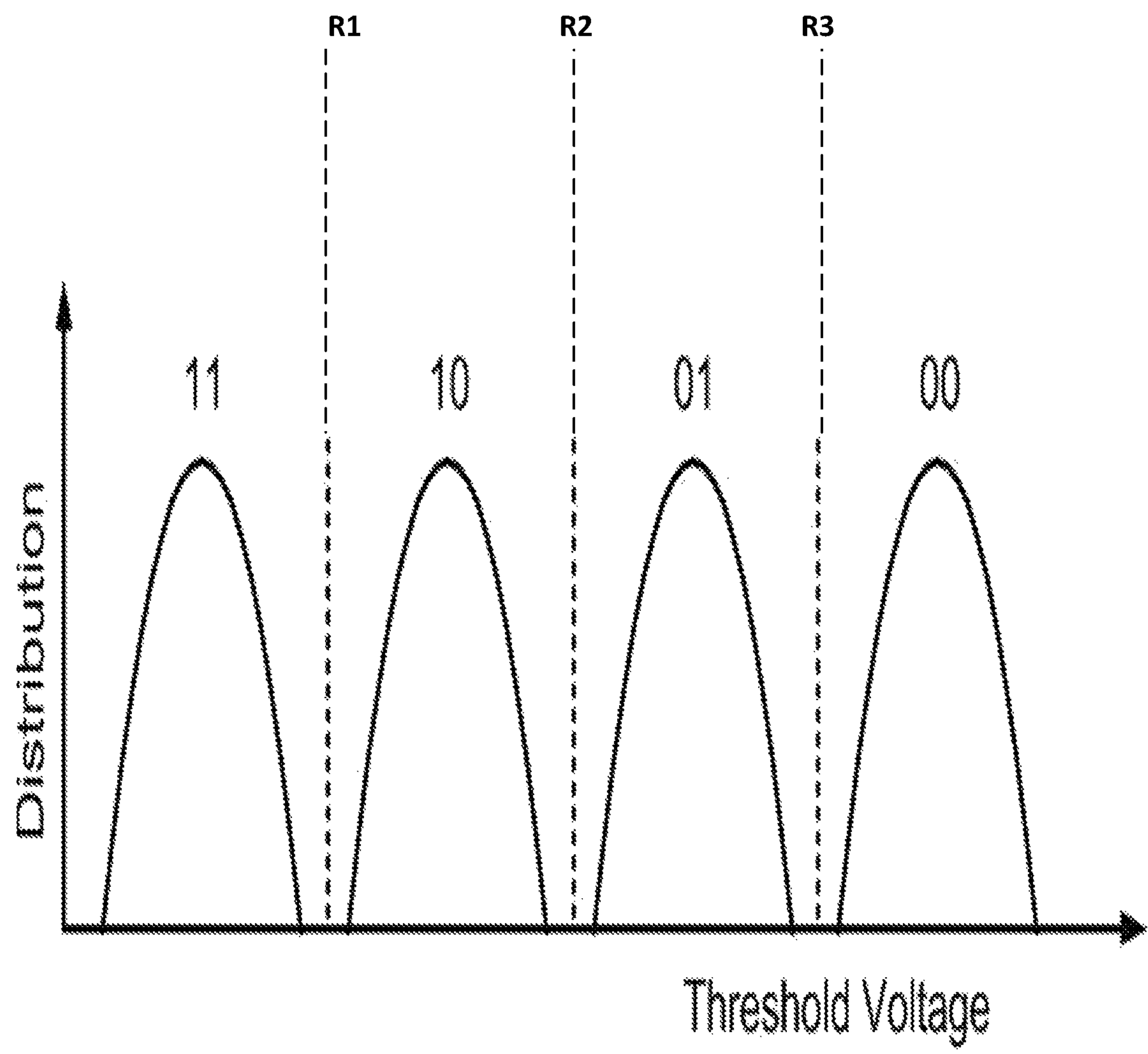
FIG. 1 is a graph illustrating the four voltage regions for two pages (upper page, lower page) in an MLC Flash memory cell.

FIG. 1 is a graph illustrating the four voltage regions (for two pages (upper page, lower page)) in a MLC Flash memory cell. Read reference voltages R1, R2, R3 are located in the non-overlapping regions of the threshold voltage regions that are determined by an upper read reference voltage and a lower read reference voltage.

During a read operation to the MLC NAND Flash memory cell, a read reference voltage (that is, R1, R2, R3) is applied to the transistor corresponding to the MLC NAND Flash memory cell. If the applied read reference voltage is higher than the threshold voltage, the transistor is turned on. The threshold voltage of the NAND Flash memory cell is compared with the applied read reference voltage to determine the logical two-bit value (00, 01, 10 or 11) represented by the threshold voltage.

In the NAND flash memory, transistors in are connected in series with adjacent cells sharing a source and a drain. Vertical strings of series-connected transistors are attached to the bit lines (BLs). The control gates of the transistors connected across different strings constitute a word line (WL). A page is a set of bit-lines linked with the same word line. For example, a page in a 2 Gigabit (Gb) SLC NAND flash die is 2112 bytes (2048 bytes of data and 64 bytes of metadata (including Error Correction Code (ECC) data for the data stored in the page). The SLC NAND flash die can have 2048 blocks, with each block having 64 pages. Data is read and written (programmed) page by page and erased block by block.

A MLC NAND Flash memory includes two pages (upper, lower) per word line, a TLC NAND Flash memory includes three pages (extra, upper, lower) per word line and a QLC NAND Flash memory includes four pages (top, extra, upper, lower) per word line.

During a read of a Flash memory cell, the threshold voltage of the Flash memory cell is compared to the read reference voltages to determine the stored logical value. The threshold voltage of the Flash memory cell can change, for example, due to program/erase cycling of the Flash memory cell (also referred to as endurance), loss of charge in the Flash memory cell (also referred to as data retention) or interference when a neighboring Flash memory cell is programed (also referred to as read disturb). A change in the threshold voltage of the Flash memory cell can result in a read error, for example, an MLC Flash memory cell storing a logical two-bit value can be misread as storing a different logical two-bit value. Error correcting codes (ECC) are used to detect and correct bit errors that may occur in the MLC Flash memory. The read reference voltages can be adjusted and the read performed (one or more times) using another read reference voltage (also referred to as read retry or moving read reference (MRR) voltage) until the read error (for example, error checking code (ECC) data) is minimized or eliminated.

Each page in the NAND Flash memory has a set of read reference voltages that are stored in a lookup table and can be selected during a read retry operation (or moving read reference operation) to minimize or eliminate a read error. For example, for a QLC NAND device there are four pages (top, extra, upper, lower) per word line and each page has a set of read reference voltages. In an embodiment, the top page has eight read reference voltages (R1, R3, R5, R7, R9, R11), the extra page has four read reference voltages (R2, R6, R10, R14) the upper page has four read reference voltages (R4, R12) and the lower page has one read reference voltage (R8).

To avoid having to perform a read retry for future reads to the page, the selected reference voltage that results in eliminating the read error for the page is selected as the optimal read voltage (also referred to as a "sticky voltage") to be used for a next read of the page. There is one optimal read voltage for each type of page (for example, top, extra, upper, lower for a QLC NAND device) stored per NAND Flash memory device in the lookup table.

However, the optimal read voltage for a page in a NAND Flash memory can vary based on the location of the word line associated with the page in the NAND Flash memory device. A workload with random reads in contrast to a workload with sequential reads results in many read retry operations due to variation in the optimal read voltage between word lines.

To reduce the number of read retries for future reads, a word line group is assigned an optimal read reference voltage per type of page, the read reference voltage that results in eliminating the read error for the word line is selected as the optimal read voltage (also referred to as a "sticky voltage") for the type of page in the word line group to be used for a next read of the page. An optimal read voltage per word line group for the type of page (for example, top, extra, upper, lower for a QLC NAND) per NAND Flash memory die is stored in the lookup table. Storing an optimal read voltage per page type per word line group instead of per die reduces the number of read retries.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Figure 2:
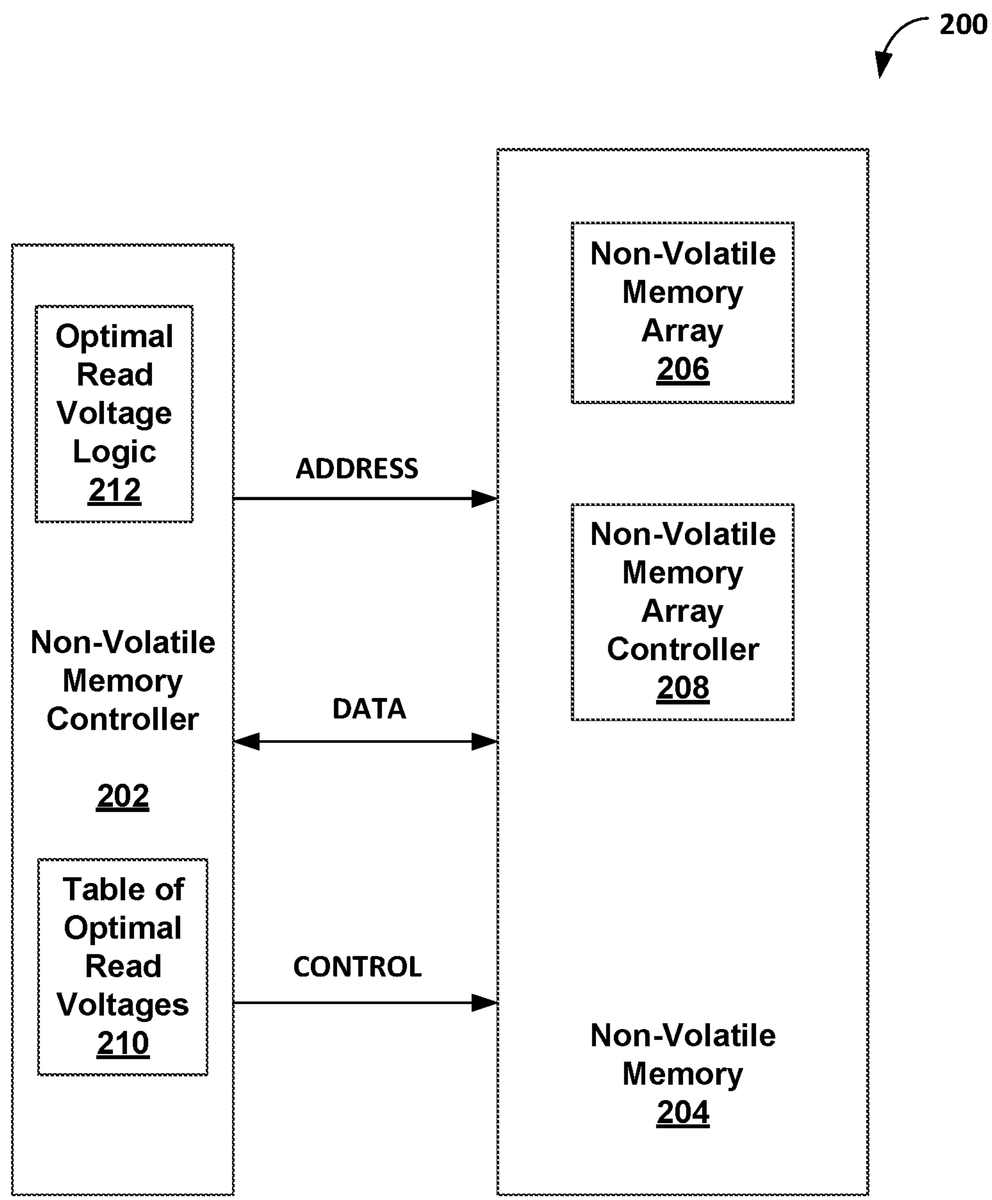
FIG. 2 is a block diagram of a non-volatile memory system that includes a non-volatile memory controller and a non-volatile memory device.

FIG. 2 is a block diagram of a non-volatile memory system 200 that includes a non-volatile memory controller 202 and a non-volatile memory device 204. The non-volatile memory controller 202 and the non-volatile memory device 204 are coupled via a control bus, data bus and address bus. The non-volatile memory device 204 includes a non-volatile memory array 206 and a non-volatile memory array controller 208.

The non-volatile memory controller 202 includes a memory to store optimal read voltages. The optimal read voltages can be stored in an optimal read voltages table 210.

Figure 3:
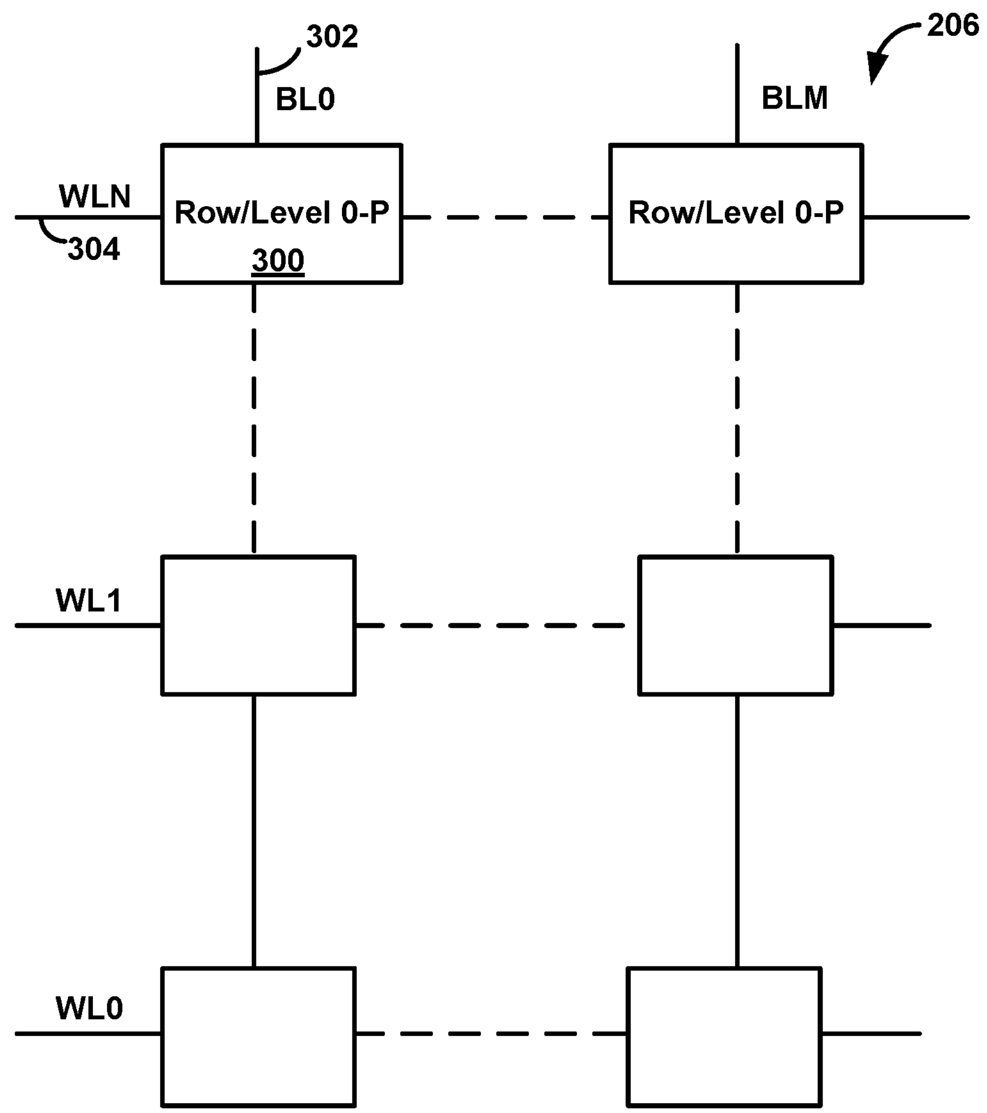
FIG. 3 is a block diagram of the non-volatile memory array in the non volatile memory device shown in FIG. 2.

FIG. 3 is a block diagram of the non-volatile memory array 208 in the non-volatile memory device 204 shown in FIG. 2. The non-volatile memory array 208 includes a plurality of non-volatile memory cells 300. Each non-volatile memory cell 300 in the non-volatile memory array 208 can be selected via a bit line 302 and a word line 304. In a non-volatile memory array that includes QLC NAND, each non-volatile memory cell 300 can store four bits, one bit per page (upper, lower, extra, top). In a non-volatile memory array that includes TLC NAND, each non-volatile memory cell 300 can store three bits, one bit per page (upper, lower, top).

A word line group associated with a plurality of word lines each word line having a plurality of pages (upper, lower, extra, top) in the QLC NAND Flash memory has a set of optimal read reference voltages (one per page type) that are stored in a lookup table and can be selected during a read retry operation (or moving read reference operation) to minimize or eliminate a read error.

The number of word lines per word group can be selected based on distance of the word lines from the source and drain. Word lines close to the source and drain may be referred to as edge word lines and are typically more prone to errors. In an embodiment of a 3D QLC NAND Flash, a group of word lines close to the source or drain can include less word lines than a group of word lines that are further from the source or drain.

Figure 4:
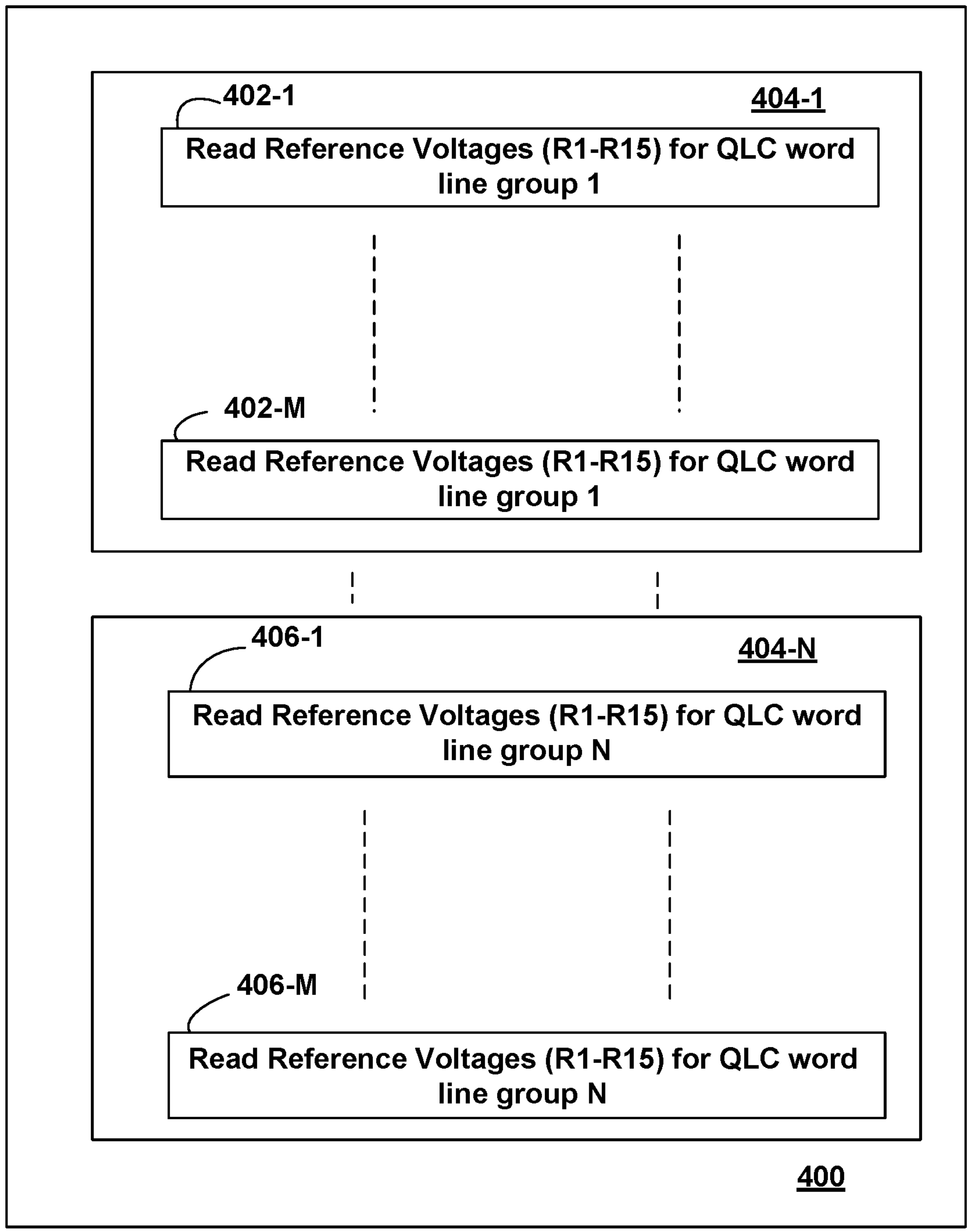
FIG. 4 is a block diagram illustrating an embodiment of a lookup table to store read reference voltage for word line groups in a QLC NAND Flash memory.

FIG. 4 is a block diagram illustrating an embodiment of a lookup table 400 to store read reference voltages for N word line groups for a QLC NAND Flash memory. The lookup table 400 includes a set of M read reference voltage entries per word line group. In the embodiment shown in FIG. 4, a set of M reference voltages for word line group 1 404-1 has M entries 402-1, . . . , 402-M. Each entry 402-1, . . . , 402-M for word line group 1 404-1 has 15 read reference voltages that can be selected as the optimal read reference voltages (one per page type) for word line group 404-1.

In the embodiment shown there are N word line groups and M entries 404-1, . . . 404-N per word line group. Each entry 404-1, . . . , 404-M for word line group 1 404-N has 15 read reference voltages that can be selected as the optimal read reference voltages (one per page type) for word line group 404-N.

FIG. 5 is a table of simulation results after 1.5K program/erase cycles have been performed in a QLC NAND Flash memory that has an optimal read voltage per word line group illustrating the reduction of read retries. The QLC NAND Flash memory has 16 blocks with 62 word lines per block, 12 sub-blocks per word line and 744 (62×12) upper pages, 744 lower pages, 744 extra pages and 744 top page per block.

As shown, in the table, based on the simulation results, read retries are reduced by a factor of 5 for upper and lower page reads for a workload with random reads. Read retries are reduced by a factor of 3 for extra page reads and by a factor of 9 for top page reads for a workload with random reads.

FIG. 6 is a table of simulation results after 3K program/erase cycles have been performed in a QLC NAND Flash memory that has an optimal read voltage per word line group. The QLC NAND Flash memory has 16 blocks with 62 word lines per block, 12 sub-blocks per word line and 744 pages (upper, lower, extra, top) per block.

As shown, in the table, based on the simulation results, read retries are reduced by a factor of 2.5 for upper page reads for a workload with random reads. Read retries are reduced by a factor of 2 for lower page and extra page reads and by a factor of 6 for top page reads for a workload with random reads.

FIG. 7 is a table illustrating components of the read bias voltage for a word line group. As shown in FIG. 7, the read bias voltage for a word line group is the sum of a base voltage, a word line group offset, and moving read reference and auto read calibration offsets.

The base voltage is fixed, power persistent and not unique for word line groups. The base voltage can be configured in the non-volatile memory device 204 by the memory controller 202 via a Set Feature command. In an embodiment, the Set Feature command is a Non-Volatile Memory Express (NVMe) command. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org.

The word line group offset voltage is power persistent and unique for word line groups. It can be configured in the non-volatile memory device 204 by the memory controller 202, for example, via a NVMe Set Features command. The base voltage is not modified during operation of the non-volatile memory device 204.

The read retry and Auto Read Calibration (ARC) offsets are not power persistent and are not unique for word line groups. Read retry and ARC offsets are managed by firmware during the operation of the non-volatile memory device 204 via a Set feature command or a command to write a wordline group offset register in the non-volatile memory device 204.

Figure 8:
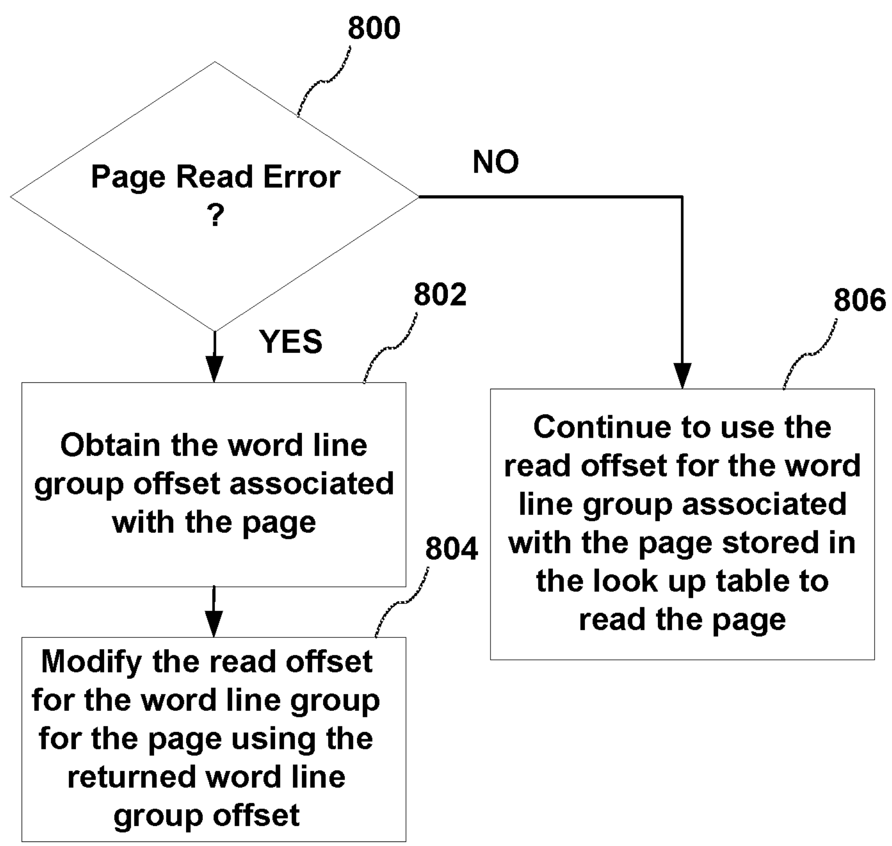
FIG. 8 is flowgraph of a method to store an optimal read voltage per word line group in the table of Optimal Read Voltages.

FIG. 8 is flowgraph of a method to store an optimal read voltage per word line group in the table of Optimal Read Voltages 210.

A Read Window Budget (RWB) in a NAND flash memory varies from word line to word line. In order to minimize variation, a group of word lines are assigned dedicated program verify and read offset voltages for each page (for example, for QLC NAND flash memory, for upper, lower, extra, and top pages. During initialization of the NAND flash memory after power is applied, the program verify and read offset voltage offsets are selected to achieve optimal read window budget (RWB) and raw bit error rate (RBER). As the number of program/erase cycles in the NAND flash memory increase, bit error rates increase and program verify and read offset voltage offsets need to be modified to improve the RBER.

At block 800, if an error is detected while reading a page in the non-volatile memory using the optimal read voltage stored for a word line group associated with the page in the table of Optimal Read Voltages 210 in the non-volatile memory controller 202, processing continues with block 802 to modify the optimal read voltage for the word line group associated with the page. If an error is not detected, processing continues with block 806.

At block 802, optimal read voltage logic 212 in the non-volatile memory controller obtains the word line group offset associated with the page from the set of word line group entries 404-1, . . . 404-N in the lookup table 400, processing continues with block 804.

At block 804, the word line group offset is added to the optimal read voltage stored word line group entries 404-1, . . . 404-N for the word line group in the lookup table 400 to provide a new optimal read voltage. Prior to the next read command, the new optimal read voltage is written to the non-volatile memory device using the N Set Feature or a vendor specific command. The new optimal read voltage is stored in the table of optimal read voltages until another read error is detected or power to the non-volatile memory is removed.

At block 806, the read offset stored in the lookup table for the word line group associated with the page is used to read the page.

After power is applied (also referred to as post power-cycle or time 0) to the non-volatile memory device, the word line group offset stored in the non-volatile memory device is set to a default value.

Figure 9:
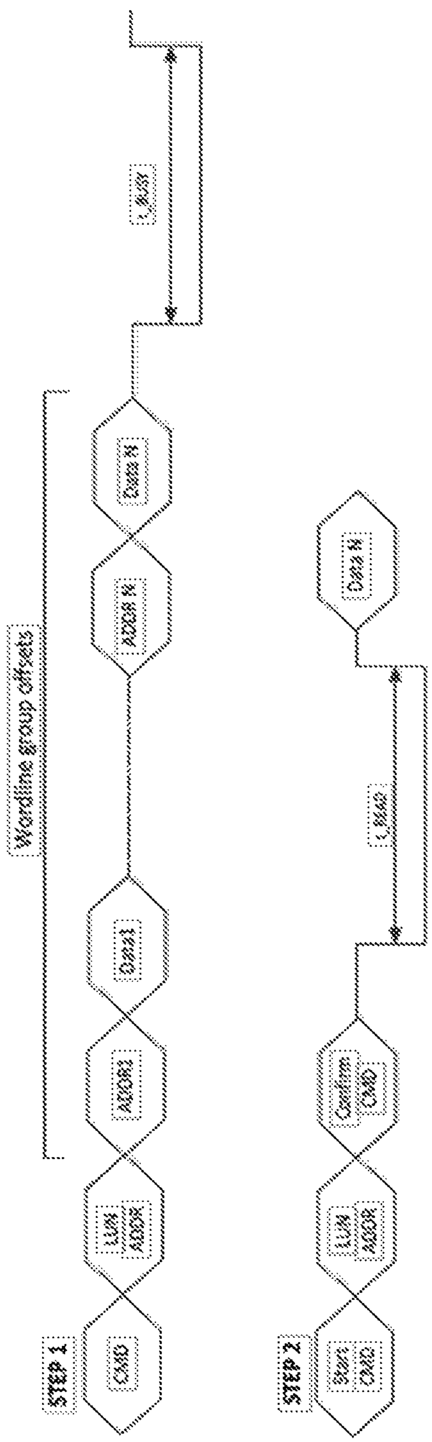
FIG. 9 is a timing diagram illustrating operation of a command to load the offsets shown in FIG. 7 for a respective word line group.

FIG. 9 is a timing diagram illustrating operation of an embodiment of a command (for example, a vendor specific command) to load the offsets shown in FIG. 7 for a respective word line group.

Referring to the timing diagram, during step 1, the command to load the offsets is sent from the memory controller 202 to the non-volatile memory device 204. The command includes a command identifier ("CMD), a logical unit (LUN) address, and word line group offsets (ADDR1, . . . , ADDRN and DATA1, . . . DATAN). The addresses (ADDR1, . . . , ADDRN). The word line group offsets store the offsets in the table at which the value of the read voltages, DATA1, . . . DATAN) are to be stored in the table. The LUN address is the address of the NAND die associated with the offsets. A LUN address is used to identify the NAND die in a system in which multiple NAND die are coupled to the same chip select signal. In an embodiment, N is 32 to allow modification of 32 offsets per command.

During step 2, a start command, LUN address and a confirm command is sent from the memory controller to the non-volatile memory device 204 to apply the word line group offsets loaded in step 1.

Step 1 and Step 2 are repeated to load word line group offsets for other word line groups.

The word line group offsets for the optimal read voltage are applied each time a read command is issued to a word line within the same word line group.

Figure 10:
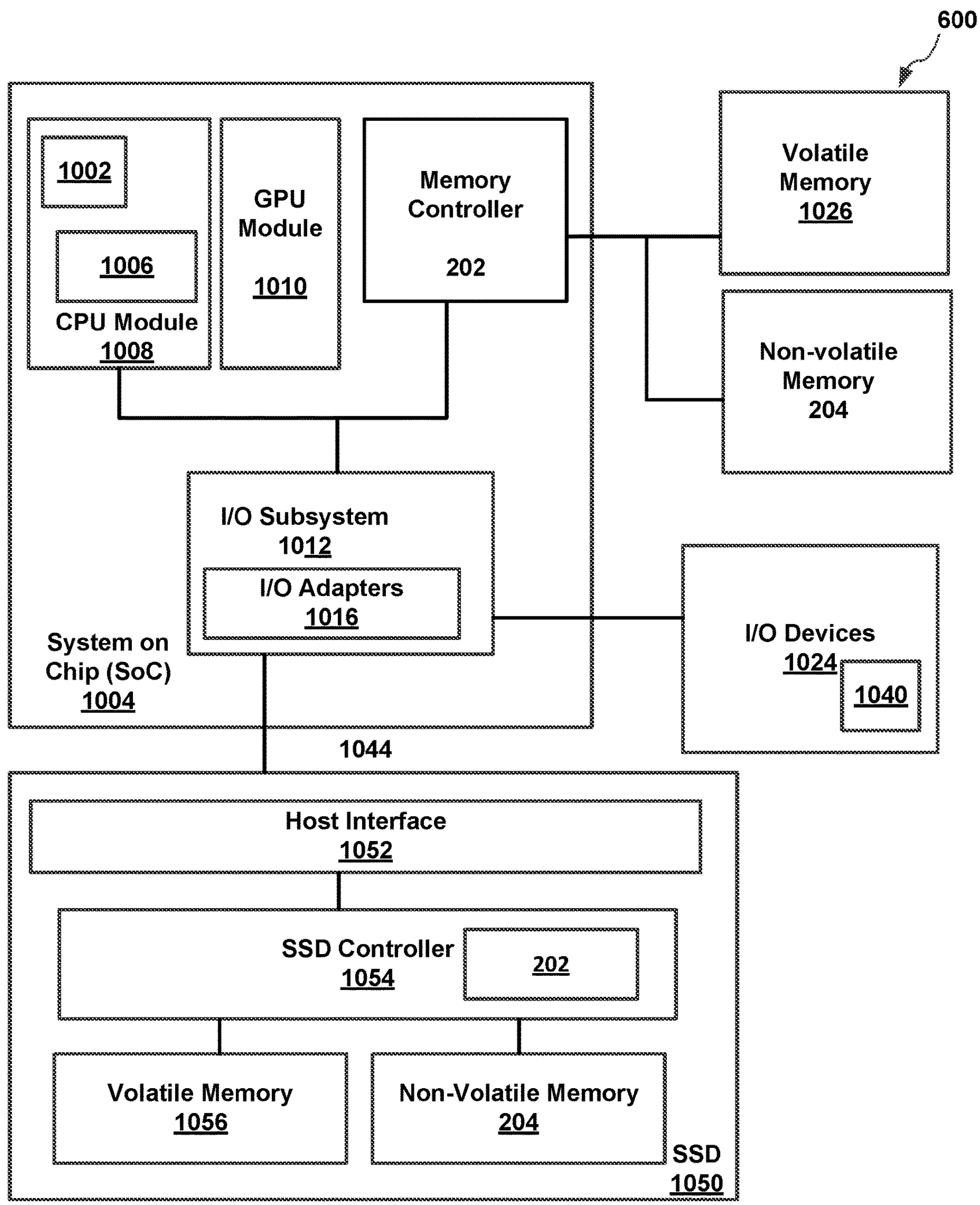
FIG. 10 is a block diagram of an embodiment of a computer system that includes a memory controller to store an optimal read voltage per word line group in a table of Optimal Read Voltages.

FIG. 10 is a block diagram of an embodiment of a computer system 1000 that includes a memory controller 202 to store an optimal read voltage per word line group in a table of Optimal Read Voltages. Computer system 1000 can correspond to a computing device including, but not limited to, a server, a workstation computer, a desktop computer, a laptop computer, and/or a tablet computer.

The computer system 1000 includes a system on chip (SOC or SoC) 1004 which combines processor, graphics, memory, and Input/Output (I/O) control logic into one SoC package. The SoC 1004 includes at least one Central Processing Unit (CPU) module 1008, a memory controller 202, and a Graphics Processor Unit (GPU) 1010. In other embodiments, the memory controller 202 can be external to the SoC 1004. The CPU module 1008 includes at least one processor core 1002, and a level 2 (L2) cache 1006.

Although not shown, each of the processor core(s) 1002 can internally include one or more instruction/data caches, execution units, prefetch buffers, instruction queues, branch address calculation units, instruction decoders, floating point units, retirement units, etc. The CPU module 1008 can correspond to a single core or a multi-core general purpose processor, such as those provided by Intel® Corporation, according to one embodiment.

The Graphics Processor Unit (GPU) 1010 can include one or more GPU cores and a GPU cache which can store graphics related data for the GPU core. The GPU core can internally include one or more execution units and one or more instruction and data caches. Additionally, the Graphics Processor Unit (GPU) 1010 can contain other graphics logic units that are not shown in FIG. 10, such as one or more vertex processing units, rasterization units, media processing units, and codecs.

Within the I/O subsystem 1012, one or more I/O adapter(s) 1016 are present to translate a host communication protocol utilized within the processor core(s) 1002 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 1016 can communicate with external I/O devices 1024 which can include, for example, user interface device(s) including a display and/or a touch-screen display 1040, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The I/O adapter(s) 1016 can also communicate with a solid-state drive ("SSD") 1050 which includes a SSD controller 1054, a host interface 1052 and non-volatile memory 204 that includes one or more non-volatile memory devices.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also include a byte-addressable write-in-place three dimensional crosspoint memory device, or other byte addressable write-in-place NVM devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

The I/O adapters 1016 can include a Peripheral Component Interconnect Express (PCIe) adapter that is communicatively coupled using the NVMe (NVM Express) over PCIe (Peripheral Component Interconnect Express) protocol over bus 144 to a host interface 128 in the SSD 118. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org. The PCIe standards are available at www.pcisig.com.

Volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

An operating system 142 is software that manages computer hardware and software including memory allocation and access to I/O devices. Examples of operating systems include Microsoft® Windows®, Linux®, iOS® and Android®.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

What is claimed is:

1. A device comprising: a memory controller configured to: determine a base voltage level; determine a read retry offset; determine an auto read calibration offset; determine a first word line group offset for a first page of a first page type in a word line group based on a location of the word line group in a block erasable non-volatile memory, the word line group associated with a plurality of word lines; determine a second word line group offset for a second page of a second page type in the word line group based on the location of the word line group in the block erasable non-volatile memory; calculate a first read reference voltage level as a sum of the base voltage level, the read retry offset, the auto read calibration offset, and the first word line group offset; calculate a second read reference voltage level as a second sum of the base voltage level, the second word line group offset, the auto read calibration offset, and the read retry offset; store a table of read reference voltage levels having an entry per page type per word line group, wherein a first entry in the table stores the first read reference voltage level for the first page of the first page type for the word line group and a second entry in the table stores the second read reference voltage level for the second page of the second page type for the word line group; read the first page of the first page type for a word line in the word line group using the first read reference voltage level; detect a first page read error in response to reading the first page; in response to detecting the first page read error, set the first read reference voltage level stored in the table equal to a third sum of the first read reference voltage level and the first word line group offset for the first page of the first page type in the word line group; read the second page of the second page type for the word line in the word line group using the second read reference voltage level; detect a second page read error in response to reading the second page; and in response to detecting the second page read error, set the second read reference voltage level stored in the table equal to a fourth sum of the second read reference voltage level and the second word line group offset for the second page of second first page type in the word line group, wherein the first page type and the second page type are different, and wherein the first word line group offset and the second word line group offset are different.

2. The device of claim 1, wherein the first read reference voltage level for the first page type for the word line group is set to a default read reference voltage when the block erasable non-volatile memory is initialized after power is applied.

3. The device of claim 1, wherein the first read reference voltage level for the first page type for the word line group is modified in response to a read retry.

4. The device of claim 1, wherein the block erasable nonvolatile memory is Quad-Level Cell NAND and the first page type is one of upper, lower, extra and top.

5. The device of claim 1, wherein the block erasable nonvolatile memory is Tri-Level Cell NAND and the first page type is one of upper, lower and top.

6. A method comprising: determining a base voltage level; determining a read retry offset; determining an auto read calibration offset; determining a first word line group offset for a first page of a first page type in a word line group based on a location of the word line group in a block erasable non-volatile memory, the word line group associated with a plurality of word lines; determining a second word line group offset for a second page of a second page type in the word line group based on the location of the word line group in the block erasable non-volatile memory; calculating a first read reference voltage level as a sum of the base voltage level, the read retry offset, the auto read calibration offset, and the first word line group offset; calculating a second read reference voltage level as a second sum of the base voltage level, the second word line group offset, the auto read calibration offset, and the read retry offset; storing a table of read reference voltage levels having an entry per page type per word line group, wherein a first entry in the table stores the first read reference voltage level for the first page of the first page type for the word line group and a second entry in the table stores the second read reference voltage level for the second page of the second page type for the word line group; reading the first page of the first page type for a word line in the word line group using the first read reference voltage level; detecting a first page read error in response to reading the first page; and in response to detecting the first page read error, setting the first read reference voltage level stored in the table equal to a third sum of the first read reference voltage level and the first word line group offset for the first page of the first page type in the word line group; reading the second page of the second page type for the word line in the word line group using the second read reference voltage level; detecting a second page read error in response to reading the second page; and in response to detecting the second page read error, setting the second read reference voltage level stored in the table equal to a fourth sum of the second read reference voltage level and the second word line group offset for the second page of second first page type in the word line group, wherein the first page type and the second page type are different, and wherein the first word line group offset and the second word line group offset are different.

7. The method of claim 6, wherein the first read reference voltage level for the first page type for the word line group is set to a default read reference voltage level when the block erasable nonvolatile memory is initialized after power is applied.

8. The method of claim 6, wherein the first read reference voltage level for the first page type for the word line group is modified in response to a read retry.

9. The method of claim 6, wherein the block erasable non-volatile memory is Tri-Level Cell NAND and the first page type is one of upper, lower and top.

10. The method of claim 6, wherein the block erasable non-volatile memory is Quad-Level Cell NAND and the first page type is one of upper, lower, extra and top.

11. A system comprising: a block erasable non-volatile memory; a memory controller communicatively coupled to the block erasable non-volatile memory and configured to: determine a base voltage level; determine a read retry offset; determine an auto read calibration offset; determine a first word line group offset for a first page of a first page type in a word line group based on a location of the word line group in a block erasable non-volatile memory, the word line group associated with a plurality of word lines; determine a second word line group offset for a second page of a second page type in the word line group based on the location of the word line group in the block erasable non-volatile memory; calculate a first read reference voltage level as a sum of the base voltage level, the read retry offset, the auto read calibration offset, and the first word line group offset; calculate a second read reference voltage level as a second sum of the base voltage level, the second word line group offset, the auto read calibration offset, and the read retry offset; store a table of read reference voltage levels having an entry per page type per word line group, wherein a first entry in the table stores the first read reference voltage level for the first page of the first page type for the word line group and a second entry in the table stores the second read reference voltage level for the second page of the second page type for the word line group; read the first page of the first page type for a word line in the word line group using the first read reference voltage level; detect a first page read error in response to reading the first page; in response to detecting the first page read error, set the first read reference voltage level stored in the table equal to a third sum of the first read reference voltage level and the first word line group offset for the first page of the first page type in the word line group; read the second page of the second page type for the word line in the word line group using the second read reference voltage level; detect a second page read error in response to reading the second page; and in response to detecting the second page read error, set the second read reference voltage level stored in the table equal to a fourth sum of the second read reference voltage level and the second word line group offset for the second page of second first page type in the word line group, wherein the first page type and the second page type are different, and wherein the first word line group offset and the second word line group offset are different.

12. The system of claim 11, wherein the first read reference voltage level for the first page type for the word line group is set to a default read reference voltage level when the block erasable non-volatile memory is initialized after power is applied.

13. The system of claim 11, wherein the first read reference voltage level for the first page type for the word line group is modified in response to a read retry.

14. The system of claim 11, wherein the block erasable non-volatile memory is Quad-Level Cell NAND and the first page type is one of upper, lower, extra and top.

15. The system of claim 11, wherein the block erasable non-volatile memory is Tri-Level Cell NAND and the first page type is one of upper, lower and top.

* * * * *